United States Patent [19]

Rasmussen

[11] Patent Number: 5,061,907
[45] Date of Patent: Oct. 29, 1991

[54] HIGH FREQUENCY CMOS VCO WITH GAIN CONSTANT AND DUTY CYCLE COMPENSATION

[75] Inventor: Richard R. Rasmussen, Fremont, Calif.

[73] Assignee: National Semiconductor Corporation, Santa Clara, Calif.

[21] Appl. No.: 642,677

[22] Filed: Jan. 17, 1991

[51] Int. Cl.$^5$ .............................................. H03B 1/00
[52] U.S. Cl. .................................. 331/57; 331/108 B
[58] Field of Search ................. 331/57, 108 A, 108 B, 331/177 R; 307/448

[56] References Cited

U.S. PATENT DOCUMENTS 4,876,519 10/1989 Davis et al. ............................ 331/57

OTHER PUBLICATIONS

Ware et al., "A 200 MHz CMOS Phase-Locked Loop with Dual Phase Detectors", IEEE Transactions on Solid State Circuits, May 10, 1989.
Yousefi, "14 MHz-100 MHz CMOS L Based Frequency Synthesizer IC".

*Primary Examiner*—Robert J. Pascal
*Attorney, Agent, or Firm*—Limbach, Limbach & Sutton

[57] ABSTRACT

The present invention provides a high frequency CMOS voltage controlled oscillator circuit with gain constant and duty cycle compensation. The voltage controlled oscillator circuit includes a multi-stage ring oscillator that includes a plurality of series-connected inverter stages comprising N-channel and P-channel transistors. The ring oscillator responds to a control current signal for controlling the frequency of oscillation of the ring oscillator. A voltage-to-current converter converts a tuning voltage input signal to a corresponding output current signal that is independent of the channel strength of the N-channel and P-channel transistors. Process compensation circuitry responds to the tuning voltage input signal to provide a current dump output signal corresponding to the channel strength of the P-channel and N-channel transistors. Trip-point compensation circuit provides a net ring current signal as the current control signal to the ring oscillator. The net ring current signal represents the difference between the output current signal and the current dump output signal and responds to the balance between the output buffer trip point and a ring oscillator dummy stage.

4 Claims, 8 Drawing Sheets

HIGH FREQUENCY CMOS VCO WITH GAIN CONSTANT AND DUTY CYCLE COMPENSATION

BACKGROUND OF THE INVENTION

1. Field of the Invention

The present invention relates to voltage-controlled oscillators and, in particular, to methods and apparatus for obtaining a variable clock frequency having a well-controlled output range and duty cycle over varying temperature, process and supply voltage.

2. Discussion of the Prior Art

As shown in FIG. 1, a basic phase-locked loop (PLL) system 10 includes three essential elements—a phase detector 12, a loop filter 14 and a voltage-controlled oscillator (VCO) 16—interconnected to form a feedback system. The phase detector 12 compares the phase of the input signal $V_s(t)$ with the output frequency $V_o(t)$ of the VCO 16 and generates an error voltage $V_d(t)$ corresponding to the difference. The error voltage signal $V_d(t)$ is then filtered by the loop filter 14 and applied to the control terminal of the VCO 16 in the form of an error voltage $V_e(t)$ to control its frequency of oscillation.

The VCO 16 is the most critical element of the PLL system 10. The tuning slope, that is, the output frequency $V_o(t)$ dependence on control voltage $V_e(t)$, is determined by the conversion gain constant $K_{VCO}$ of the VCO 16. Similarly, the linearity of the voltage-to-frequency conversion characteristics of the PLL system 10 is determined solely by the limitations of the control characteristics of the VCO 16. Thus, the stability and control characteristics of the VCO 16 are key design parameters in monolithic PLL circuits.

The VCO 16, which is basically an analog circuit, must be immune to on-chip and off-chip noise sources. If it is not, then its output $V_o(t)$ will exhibit short-term frequency instability, or jitter. Maintaining a low VCO gain constant $K_{vco}$ is one method of reducing noise sensitivity. The required operating frequency for conventional VCOs ranges from a few MHz to beyond 200 MHz. Tuning ranges up to 2 to 1 are also required. To be easily compatible with 5 V power supply constraints and minimum phase detector/charge pump solutions, the tuning voltage should be approximately 1.5 V to ($V_{cc}$ − 1.5 V).

As stated above, the VCO gain constant $K_{vco}$ must be well controlled so that loop filtering schemes are predictable and stable. This is especially important in data acquisition and mass storage applications such as disk controllers and constant density recording. At higher output frequencies, the duty cycle is also critical.

In many applications, the process of choice for VCO design has been complementary-metal-oxide-semiconductor (CMOS) technology. However, previous CMOS VCO designs have been greatly affected by process variations, which can cause large changes in the VCO gain constant $K_{vco}$, and/or have required external trimming components. External trimming adds pins and cost to the PLL chip and provides an antenna through which noise can be coupled into the sensitive analog sections of the chip.

One example of a high frequency CMOS phase-locked loop is described by Ware et al, "a 200 MHz CMOS Phase-Lock-Loop with Dual Phase Detectors", IEEE Transactions on Solid State Circuits, May 10, 1989. The Ware et al PLL features a VCO that requires the use of a bandgap regulator that relies on parasitic NPN transistors. It achieves frequency control by varying the applied voltage across the ring oscillator stages. The VCO utilized by Ware is based on a ring of three inverting amplifiers.

Yousefi, "14 MHz-100 MHz CMOS PLL Based Frequency Synthesizer IC", describes a PLL design where the VCO gain constant compensation depends upon the use of an external resistor.

U.S. Pat. No. 4,876,519, issued on Oct. 24, 1989 to Craig M. Davis and Richard R. Rasmussen, and commonly assigned herewith, discloses a PLL implementation in emitter-coupled-logic (ECL) technology. Although the Davis/Rasmussen design provides significant advantages, its Bipolar/CMOS process requirement prohibits its use in some applications.

It would, therefore, be desirable to have available a CMOS-based PLL that features good VCO frequency control, gain control and duty-cycle characteristics without using external components.

SUMMARY OF THE INVENTION

The present invention provides a high frequency CMOS voltage controlled oscillator circuit with gain constant and duty cycle compensation. The voltage controlled oscillator circuit includes a multi-stage ring oscillator that includes a plurality of series-connected inverter stages comprising N-channel and P-channel transistors. The ring oscillator responds to a control current signal for controlling the frequency of oscillation of the ring oscillator. A voltage-to-current converter converts a tuning voltage input signal to a corresponding output current signal that is independent of the channel strength of the N-channel and P-channel transistors. Process compensation circuitry responds to the tuning voltage input signal to provide a current dump output signal corresponding to the channel strength of the P-channel and N-channel transistors. Trip-point compensation circuit provides a net ring current signal as the current control signal to the ring oscillator. The net ring current signal represents the difference between the output current signal and the current dump output signal.

A better understanding of the features and advantages of the present invention will be obtained by reference to the following detailed description and accompanying drawings which set forth an illustrative embodiment in which the foregoing features of the invention are utilized.

DETAILED DESCRIPTION OF THE INVENTION

Figure 1:
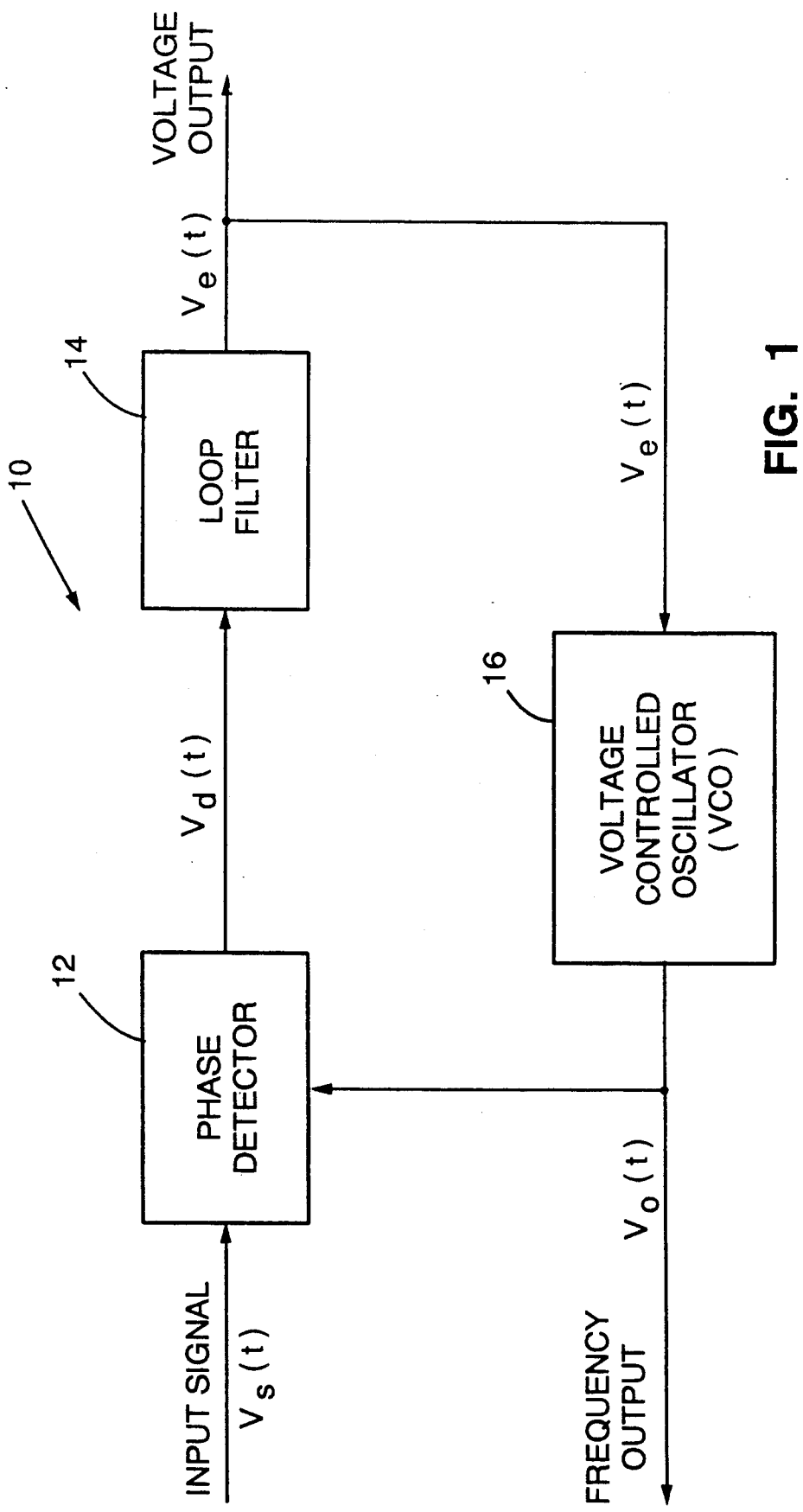
FIG. 1 is a block diagram illustrating the basic elements of a conventional phase-locked loop (PLL).
Figure 2:
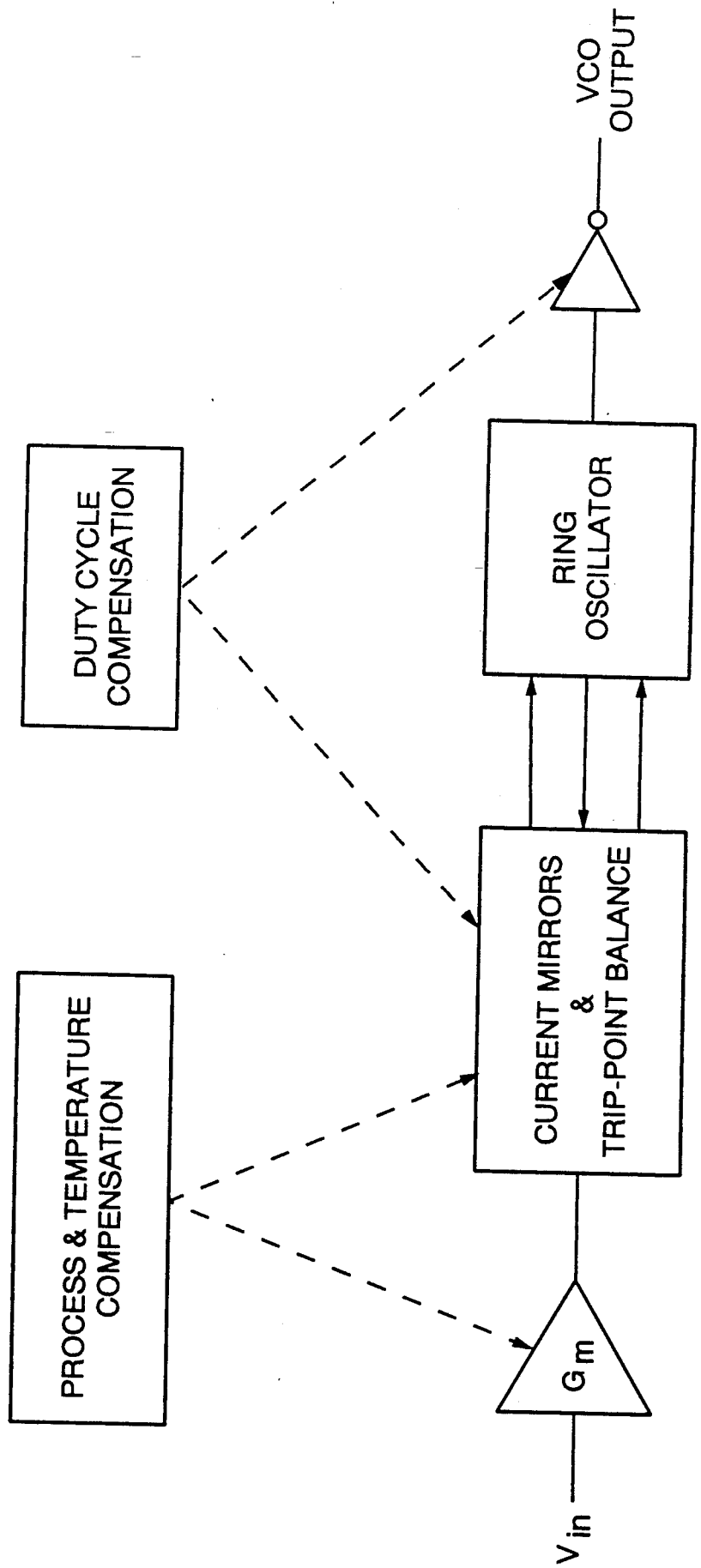
FIG. 2 is a block diagram illustrating an embodiment of voltage-controlled oscillator (VCO) in accordance with the present invention.

FIG. 2 shows a block diagram of a CMOS voltage-controlled oscillator (VCO) 20 with gain constant and duty cycle compensation in accordance with the present invention.

VCO 20 includes a voltage-to-current V/I converter 22 with gain Gm that amplifies input signal $V_{in}$ to current mirror and trip-point compensation circuitry 24. The outputs of the trip-point compensation circuitry 24 are provided to a CMOS ring oscillator 26. The selected phase signal of the ring oscillator 26 is provided as the VCO output via an output buffer 28.

In accordance with the present invention, the VCO 20 includes process and temperature compensation for the V/I converter 22 and process compensation for the trip-point circuitry 24. Duty cycle compensation for both the trip-point balance circuitry 24 and the output buffer 28 is derived from matching devices within these two circuit elements.

Figure 3:
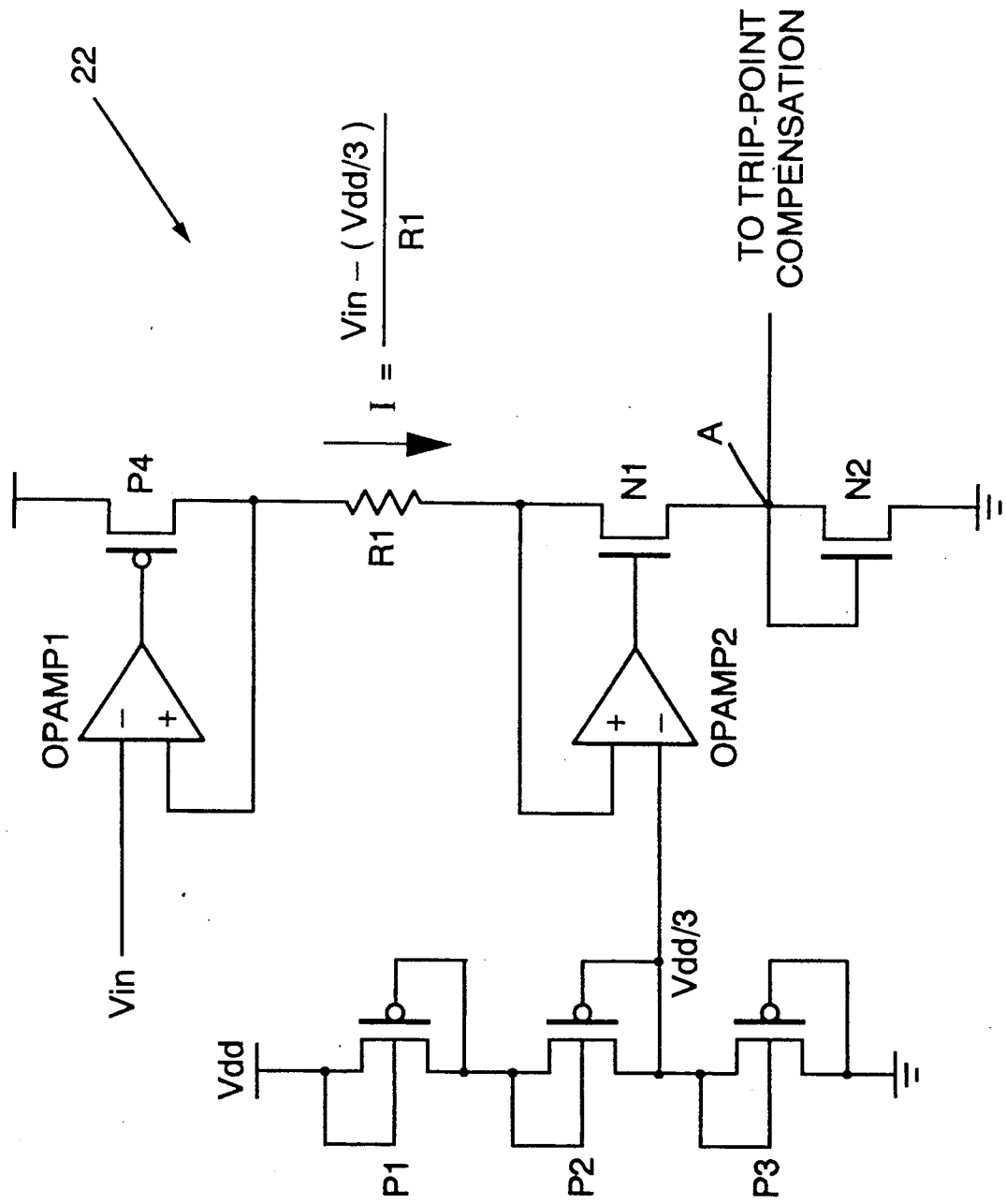
FIG. 3 is a schematic diagram illustrating an embodiment of a V/I converter utilizable in the VCO shown in FIG. 2.

An embodiment of a V/I converter 22 utilizable in the VCO 20 is shown in greater detail in FIG. 3.

In the FIG. 3 V/I converter circuit 22, tuning voltage input signal $V_{in}$ is provided to the inverting input of operational amplifier OPAMP1. The non-inverting input of op amp OPAMP1 is connected to the drain of P-channel transistor P4 which is driven by the output of op amp OPAMPI. A second operational amplifier OPAMP2 drives N-channel sense transistor N1, which has its source connected to an output node A. The non-inverting input of op amp OPAMP2 is connected to the drain of P-channel sense transistor P4 via internal current control resistor R1. The inverting input of op amp OPAMP2 is connected to receive a $V_{DD}$ driver stage output, the driver stage comprising three series-connected, P-channel transistors P1, P2 and P3 which are connected between a supply voltage $V_{DD}$ and ground. An N-channel output mirror transistor N2 is connected between the output node A and ground.

Thus, the output current at node A of the V/I converter 22 is controlled by forcing the bottom side of resistor R1 to $V_{DD}/3$ and the top side of resistor R1 to $V_{in}$. The output current is, therefore, $$I = \frac{V_{in} - (V_{DD}/3)}{RI}$$

and is relatively independent of supply $V_{DD}$ and its only process sensitivity is the tolerance of the internal resistor R1. The transconductance slope is totally independent of supply $V_{DD}$.

Resistor R1 can also be an external component for even greater accuracy. In this case, both external connections are floating above ground and external noise can be made common-mode.

The current at node A is then mirrored into the ring oscillator 26, as described below.

Figure 4:
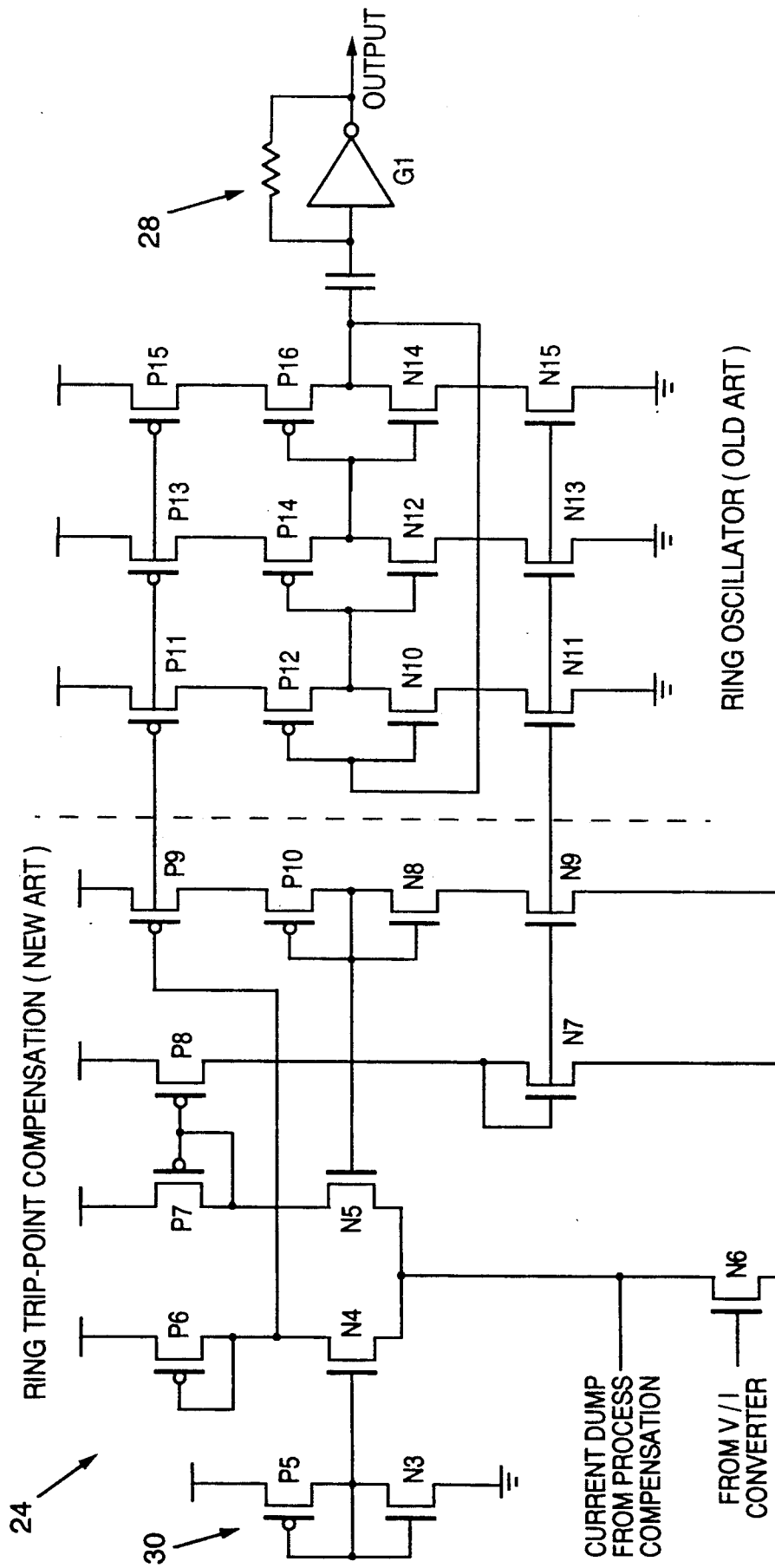
FIG. 4 is a schematic diagram illustrating an embodiment of ring trip-point compensation circuitry together with a conventional ring oscillator utilizable in the VCO shown in FIG. 2.

An embodiment of current mirror and ring trip-point compensation circuitry 24 is shown in greater detail in FIG. 4.

Trip-point compensation is desirable in order to maintain symmetric VCO output waveforms as the process varies. For example, when the process tends toward weak N-channel and strong P-channel transistors, the resultant VCO output waveform will have a higher duty cycle than when the N-channel and P-channel transistor strengths are well matched.

The FIG. 4 circuit includes a differential stage, comprising N-channel transistors N4 and N5, that allows the total ring oscillator current from the V/I converter 22 to be shared as process shift demands. That is, as the P-channel transistors of the VCO get weaker because of process variation, the self-biased inverter (transistors P10 and N8) voltage in the FIG. 4 circuit will tend to drop, forcing more current to be steered through input transistor N4 and then mirrored from P-channel transistor P6 to P-channel current sensing transistors P9, P11, P13 and P15. Similarly, when the N-channel transistors get weaker, more current is steered through P-channel input transistor P7 and mirrored into transistors P8 and N7 and current sensing transistors N9, N11, N13 and N15.

As further shown in FIG. 4, the ring trip-point compensation circuitry includes a dummy inverter stage (transistors P10 and N8) that is identical in form to the three inverter stages (P12/N10, P14/N12 and P16/N14) of the ring oscillator.

The ring oscillator is a standard design having an output frequency equal to 1/6T, where T is the propagation delay of an inverter (P12/N10, P14/N12, P16/N14).

Figure 4A:
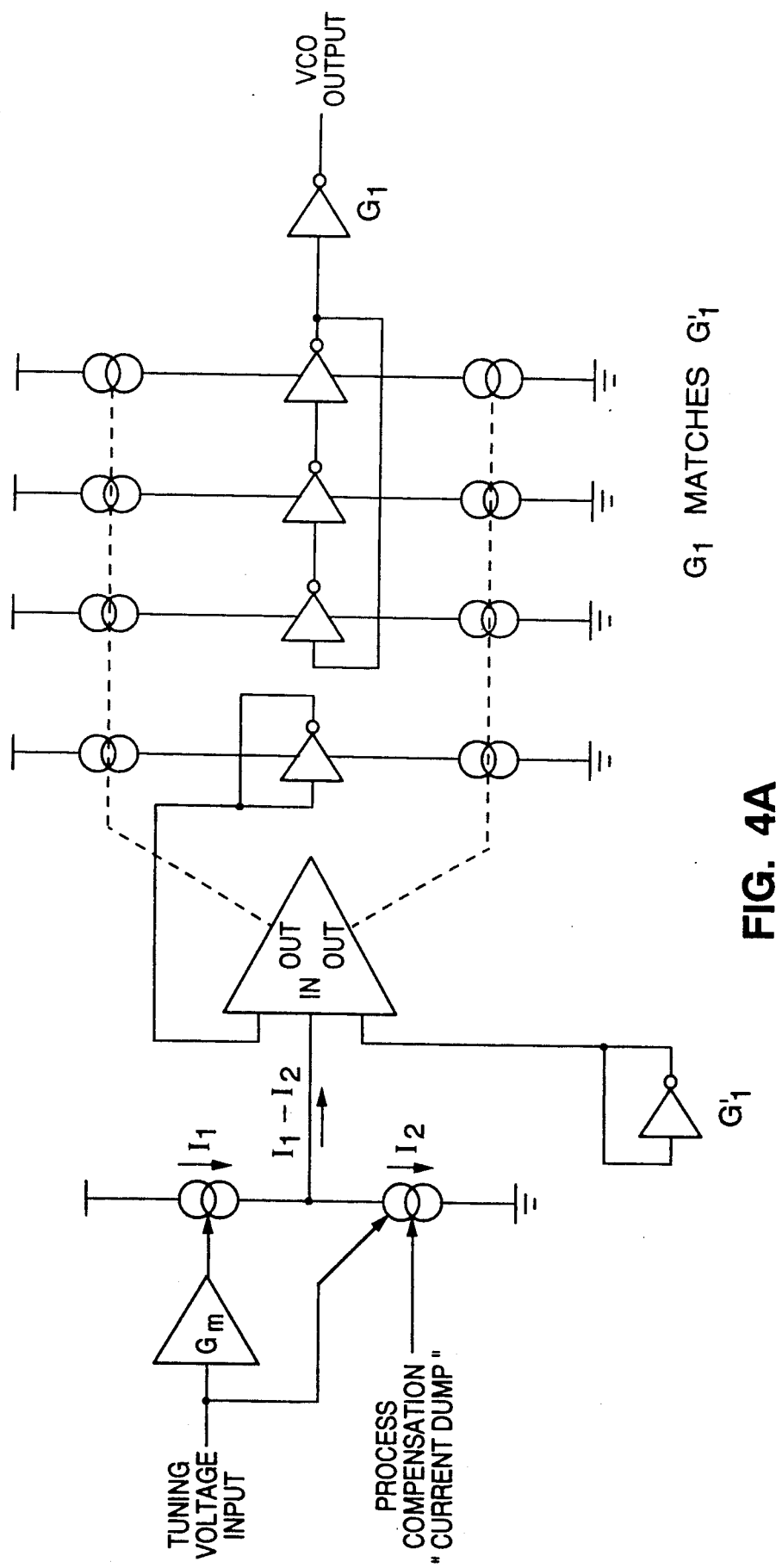
FIG. 4A is a schematic diagram illustrating a generalized representation of the FIG. 4 circuit.

From the above description, those skilled in the art will recognize that the FIG. 4 circuitry can be more generally illustrated as shown in FIG. 4A. That is, as shown in FIG. 4A, the amplified V/I converter control input received from buffer Gm drives a first current I1. The current dump from the process compensation circuitry drives a second current source I2. The net ring oscillator current equals the V/I current I1 minus the process compensation current I2.

As shown in FIG. 4, the compensation circuit 24 uses a self-biased inverter 30 comprising P-channel transistor P5 and N-channel transistor N3 to drive the ring oscillator bias such that the resultant oscillation is also matched with the output buffer GI. Output buffer GI amplifies and squares the ring oscillator signal.

Figure 5:
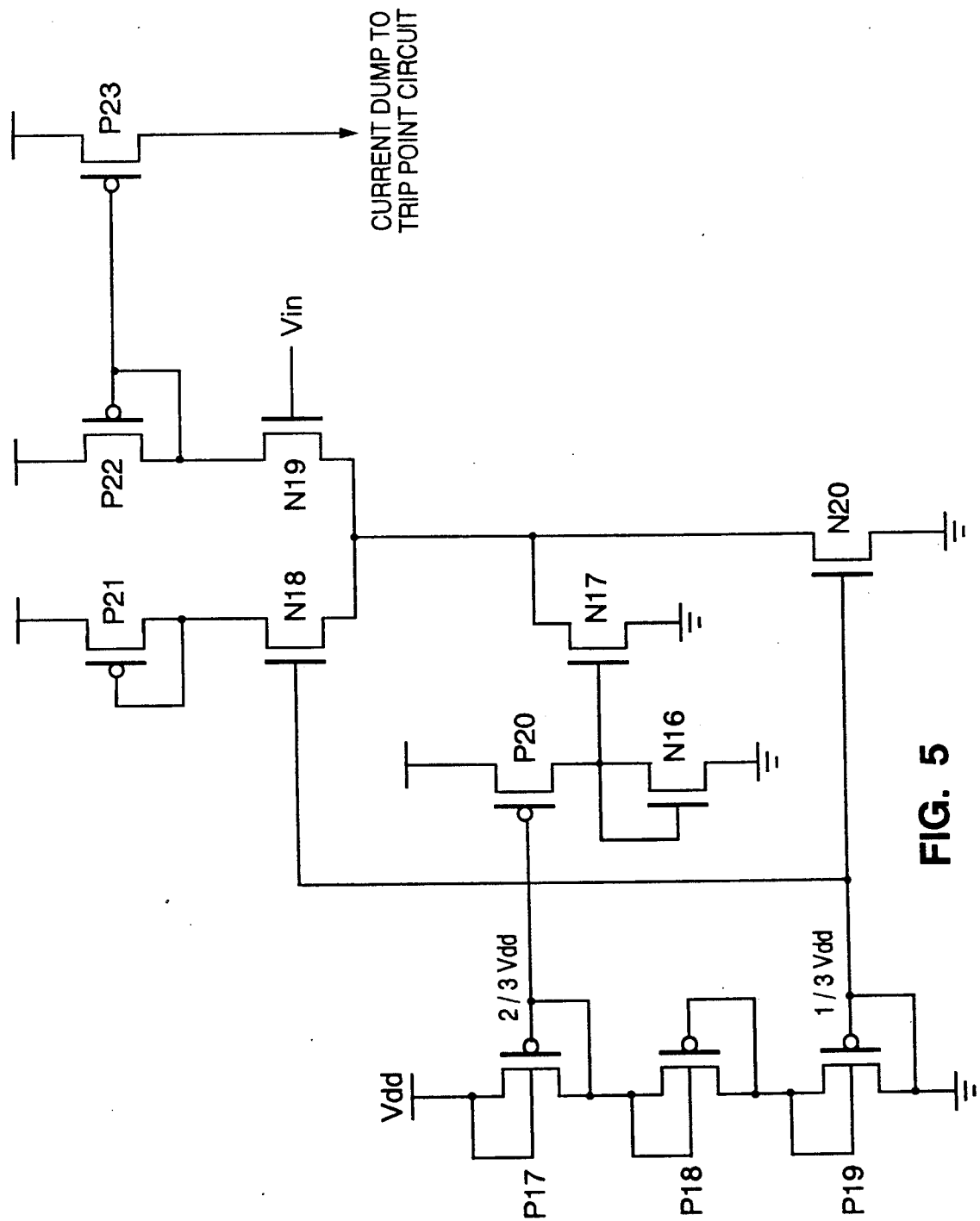
FIG. 5 is a schematic diagram illustrating an embodiment of process compensation circuitry utilizable in the VCO shown in FIG. 2.

An embodiment of process compensation circuitry is shown in detail in FIG. 5.

The process compensation circuit maintains a constant frequency tuning range over process variations such as transistor threshold voltage, transconductance and source/drain capacitance. It also compensates for externally induced variations, such as temperature and supply voltage $V_{DD}$.

As shown in FIG. 5, a $V_{DD}$ voltage splitter stage consisting of P-channel transistors P17, P18 and P19 sets up a $V_{DD}$-dependent gate bias on P-channel transistor P20 and N-channel transistor N20. As P-channel strength increases, the currents in N-channel sensing transistors N16 and N17 increase proportionally. Likewise, as N-channel strength increases, the current in N-channel sensing transistor N20 increases. The P-channel and N-channel strength-dependent currents sum to become the tail current in the differential stage comprising N-channel transistors N18 and N19, which is part of a $K_{VCO}$ compression network. Thus, as the tuning voltage $V_{in}$ applied to input transistor N19 increases, so does the current in P-channel transistor P22 and P-channel mirror transistor P23. This current dumps into the trip-point compensation circuit 24 and effectively "steals" current away from the ring oscillator, thereby maintaining a constant output frequency. Since the "stolen" current is proportional to the tuning voltage $V_{in}$, the VCO gain constant $K_{VCO}$ is further compressed.

Figure 5A:
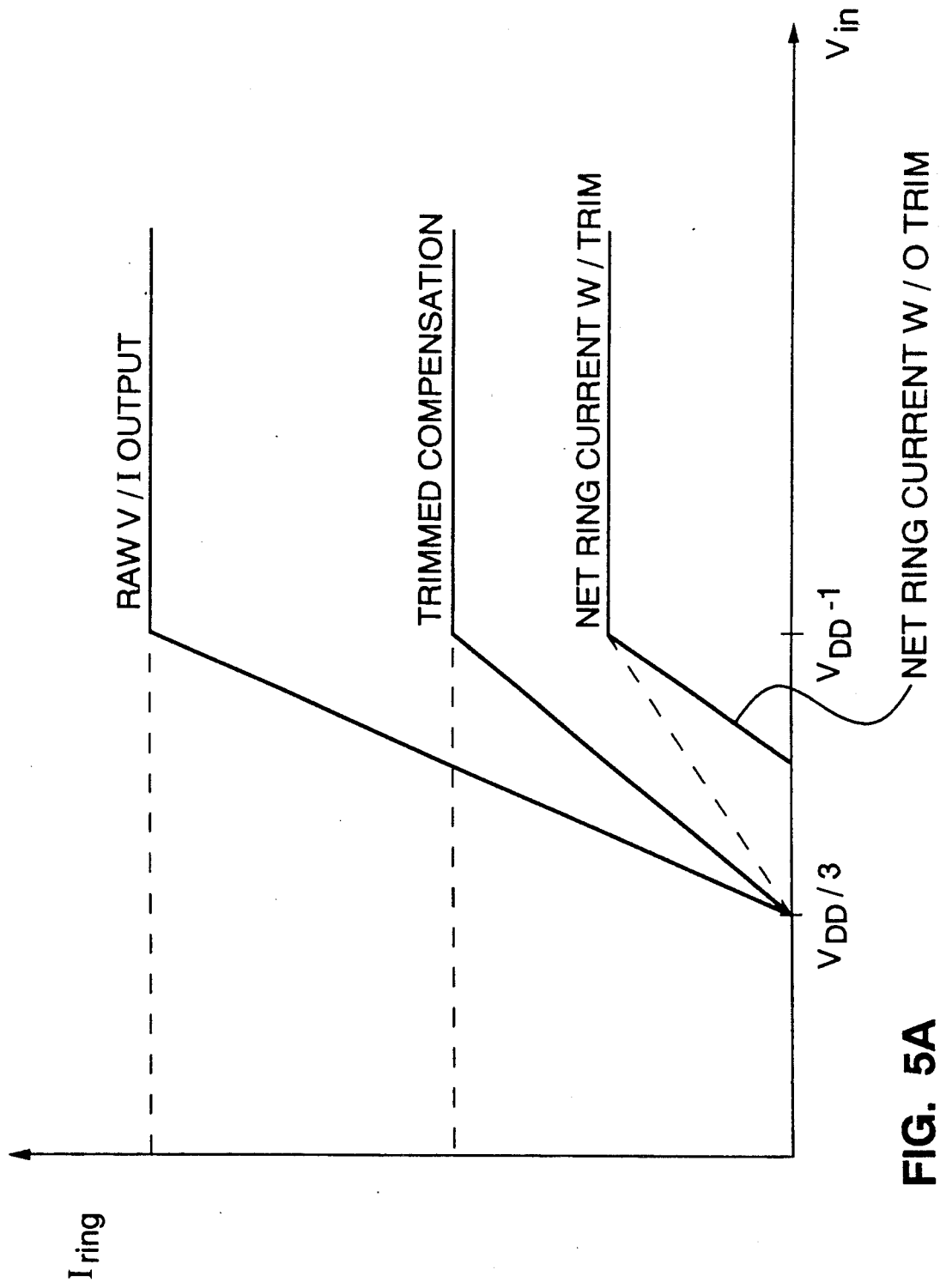
FIG. 5A is a plot of control current to the ring oscillator versus tuning voltage.

This concept is further illustrated in the FIG. 5A plot of control current $I_{ring}$ to the ring oscillator versus tuning voltage $V_{in}$. As shown in FIG. 5A, the current $I_{ring}$ supplied by the V/I converter circuit (FIG. 3) rises from zero When $V_{in}$ equals $V_{DD}/3$, the slope of the curve being dependent on the value of resistor RI. As stated above, as process strength varies, the slope of the V/I converter output remains constant. Thus, without current trimming, the net ring current will not be process dependent. With current trimming provided in accordance with the present invention, ring current $I_{ring}$ is controlled over a widened range of tuning voltages $V_{IN}$.

Figure 6:
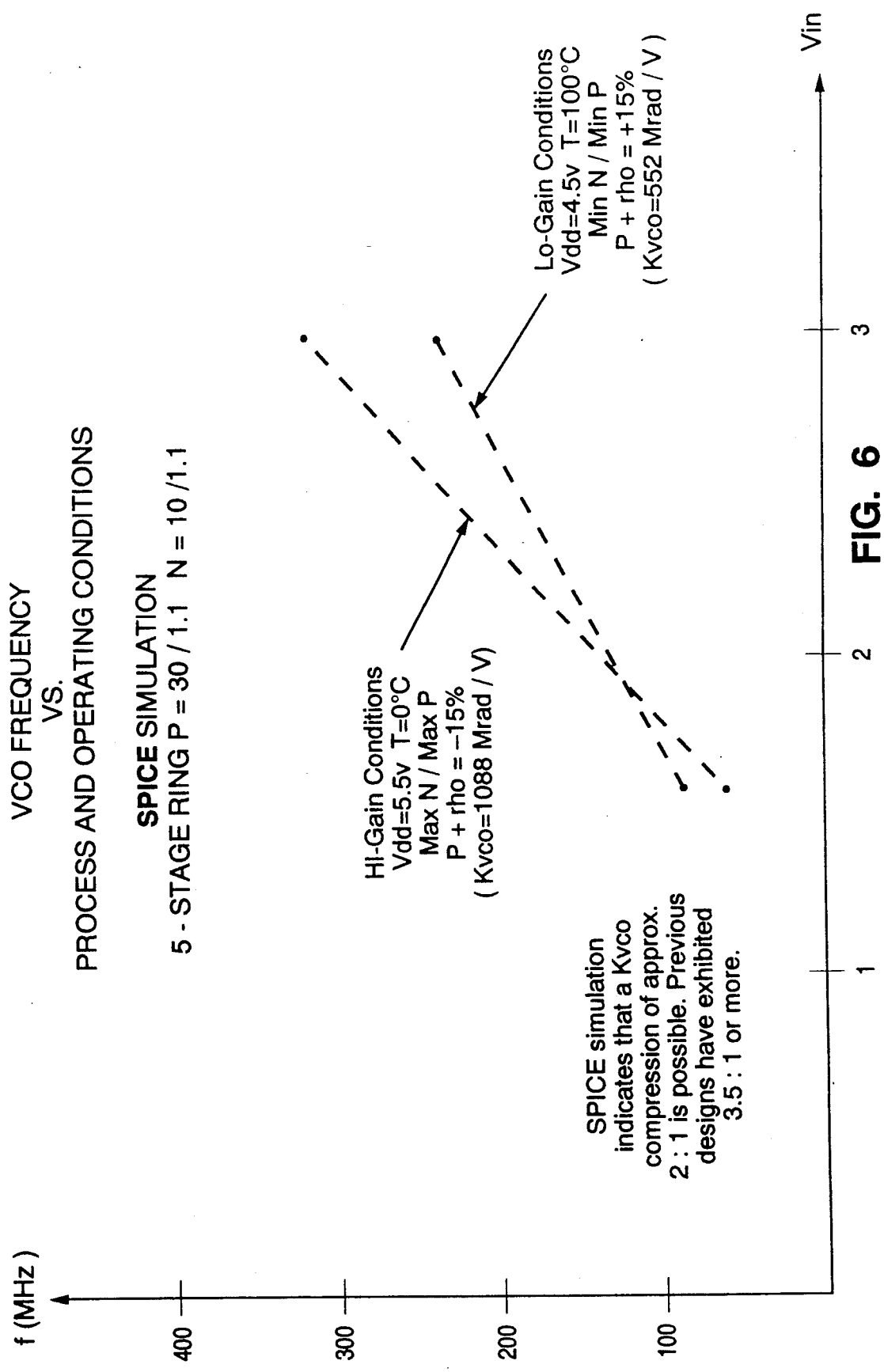
FIG. 6 is a graph illustrating VCO frequency versus process and operating conditions for a VCO in accordance with the present invention.

FIG. 6 provides a plot of VCO frequency versus process and operating conditions based on a SPICE simulation of the concepts of the invention described above for a 5 V integrated circuit under worst case operating conditions. The simulation indicates that VCO gain constant ($K_{VCO}$) compression of approximately 2:1 is possible. Conventional VCO designs exhibit gain constant compression of 3.5:1 or more.

It should be understood that various alternatives to the embodiments of the invention described herein may be employed in practicing the invention. It is intended that the following claims define the scope of the invention and that methods and apparatus within the scope of these claims and their equivalents be covered thereby.

What is claimed is:

1. A voltage controlled oscillator circuit comprising:
   (a) multi-stage ring oscillator means that includes a plurality of series-connected inverter stages comprising N-channel and P-channel transistors, the ring oscillator means responsive to a control current signal for controlling the frequency of oscillation of the ring oscillator means; and
   (b) voltage-to-current converter means for converting a tuning voltage input signal to a corresponding output signal that is independent of the channel strength of the N-channel and P-channel transistors;
   (c) process compensation means responsive to the tuning voltage input signal for providing a current dump output signal corresponding to the channel strength of the P-channel and N-channel transistors; and
   (d) trip-point compensation means responsive to the output signal and the current dump output signal to provide a net ring current signal as the control current signal to the ring oscillator means, the net ring current signal representing the difference between the output signal and the current dump output signal and responding to the balance between the output buffer's input threshold and a ring inverter dummy stage.

2. A voltage controlled oscillator circuit as in claim 1 wherein the voltage-to-current converter means comprises:
   (a) supply voltage divider means connected between a supply voltage and ground for providing a voltage driver output signal;
   (b) a first operational amplifier that receives the tuning voltage input signal at its inverting input;
   (c) a second operational amplifier that receives the voltage driver output signal at its inverting input;
   (d) a P-channel sense transistor having its gate connected to receive the output signal of the first operational amplifier, its source connected to the supply voltage and its drain connected both to the non-inverting input of the first operational amplifier and to the first side of a current control resistor;
   (e) a N-channel sense transistor having its gate connected to receive the output signal of the second operational amplifier, its drain connected both to the non-inverting input of the second operational amplifier and to the second side of the current control resistor, and its source connected to an output node that provides the output current signal; and
   (f) a N-channel output mirror transistor having its drain and gate commonly connected to the output node and its source connected to ground.

3. A voltage controlled oscillator circuit as in claim 1 wherein the process compensation means comprises:
   (a) supply voltage splitter means connected between the supply voltage and ground for generating first and second bias voltage output signals;
   (b) channel strength sensing means responsive to the first and second bias voltage output signals for providing a tail current signal; and
   (c) gain constant compression means responsive to the tail current and to the tuning voltage input signal for providing current dump output signal corresponding to the tuning voltage input signal.

4. A voltage controlled oscillator circuit as in claim 1 wherein the trip-point compensation means comprises:
   (a) current steering means for steering the control current signal to the ring oscillator means depending upon the channel strength of the N-channel and P-channel transistors;
   (b) an input node for providing the current dump output signal as tail current to the current steering means; and
   (c) a N-channel transistor connected between the input node and ground for providing the current input to the ring oscillator.

* * * * *